United States Patent
Deacon et al.

(10) Patent No.: US 6,171,966 B1
(45) Date of Patent: Jan. 9, 2001

(54) DELINEATION PATTERN FOR EPITAXIAL DEPOSITIONS

(75) Inventors: Thomas E. Deacon, Sunnyvale; Norma B. Riley, Pleasanton, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/698,552

(22) Filed: Aug. 15, 1996

(51) Int. Cl.[7] ................................ H01L 21/3065
(52) U.S. Cl. .................. 438/700; 438/705; 438/719; 438/733; 216/39; 216/62; 117/95; 117/97
(58) Field of Search .................. 438/524, 694, 438/700, 705, 710, 712, 719, 733, 924; 216/17, 39, 51, 62; 117/94, 95, 96, 97

(56) References Cited

U.S. PATENT DOCUMENTS

| | | | |
|---|---|---|---|
| 3,909,304 | * 9/1975 | Cho | 148/1.5 |
| 4,000,019 | * 12/1976 | Van Den Brekel | 148/175 |
| 4,426,767 | * 1/1984 | Swanson et al. | 29/571 |
| 4,487,653 | * 12/1984 | Hatcher | 438/700 |
| 4,584,055 | * 4/1986 | Kayanuma et al. | 156/628 |
| 4,693,781 | * 9/1987 | Leung et al. | 156/643 |
| 4,717,687 | * 1/1988 | Verma | 437/97 |
| 4,737,468 | * 4/1988 | Martin | 437/26 |
| 5,196,358 | * 3/1993 | Boos | 437/40 |
| 5,432,120 | * 7/1995 | Meister et al. | 437/89 |
| 5,780,353 | * 7/1998 | Omid-Zohoor | 438/433 |

OTHER PUBLICATIONS

Enomoto, T. et al "Pattern washout effect in epitaxial process of iintegrated circuit fabrication" Japanese J. Appl. Phys., vol. 8, No. 11, pp. 1301–1306, Nov. 1969.*

* cited by examiner

Primary Examiner—Randy Gulakowski
Assistant Examiner—Anita Alanko
(74) Attorney, Agent, or Firm—Blakely, Sokoloff Taylor & Zafman

(57) ABSTRACT

An improved delineation pattern for epitaxial depositions is created by forming a mask on a single-crystal silicon substrate which leaves an area (10) of the substrate exposed, doping the area with a dopant to create a doped region defined by a periphery, anisotropically, vertically etching the doped region to create a delineation pattern corresponding to the periphery, and then forming an epitaxial layer over the substrate and doped region. The periphery of the delineation pattern has a squared-off delineation step including a first step wall generally perpendicular to the surface of the substrate and a second step wall generally parallel to the surface of the substrate. The squared-off delineation step helps prevent wash-out of the delineation pattern as one or more epitaxial layers are deposited on the substrate.

13 Claims, 2 Drawing Sheets

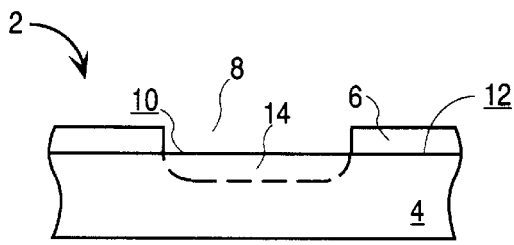
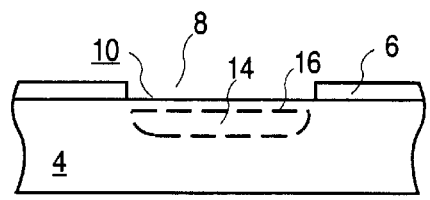
FIG. 1 (PRIOR ART)　　　FIG. 2 (PRIOR ART)
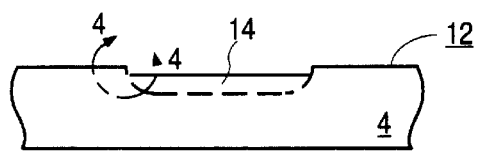
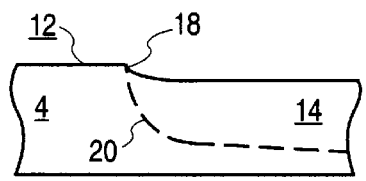
FIG. 3 (PRIOR ART)　　　FIG. 4 (PRIOR ART)
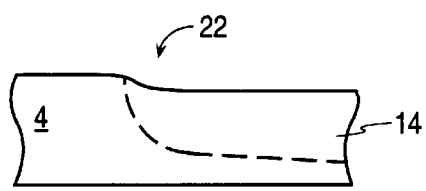
FIG. 4A (PRIOR ART)
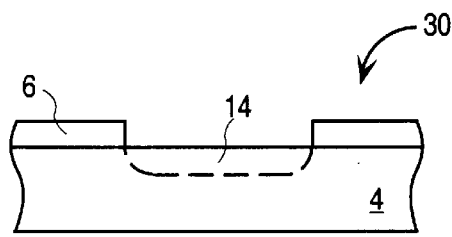
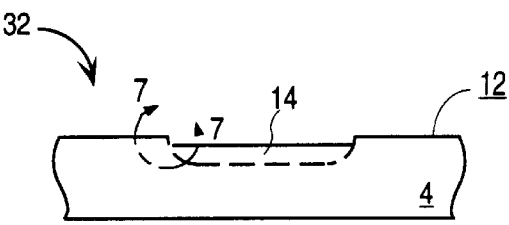
FIG. 5　　　FIG. 6

ANGLE RELATIVE TO [111] DIRECTION (DEGREES)
(CRYSTALOGRAPHIC ORIENTATION)

DELINEATION PATTERN FOR EPITAXIAL DEPOSITIONS

TECHNICAL FIELD OF THE INVENTION

The present invention relates to method for use in semiconductor fabrication and, in particular, to method for forming a delineation step pattern for epitaxial depositions by which pattern wash-out is substantially reduced.

BACKGROUND OF THE INVENTION

One technique for manufacturing semiconductor devices involves depositing epitaxial layers on a silicon wafer. The use of epitaxial layers provides several advantages, including the ability to alter dopant levels and types. Additionally, one may use a buried layer, also called a diffused subcollector, that is precisely located beneath an active device formed by later fabrication steps. Such precise location requires registration between the buried layer and the active device and the present invention provides a method for registrating these later device fabrication steps with the buried layer.

FIG. 1 illustrates a conventional semiconductor structure 2 comprising a monocrystalline silicon wafer substrate 4 on which an oxide mask 6 has been deposited. Substrate 4 has a <100> crystallographic orientation. As shown in FIG. 1, gap 8 in oxide mask 6 exposes a portion 10 of surface 12 of substrate 4. A doped region 14 is created at gap 8 by conventional means, typically by diffusing or implanting dopant into the exposed, oxide-free surface 10. The dopant is preferably driven into substrate 4 at an elevated temperature, such as 900° C–1200° C.

FIGS. 2–4A illustrate further fabrication steps in accordance with the prior art. As shown in FIG. 2, a delineation oxide layer 16 is formed on top of doped region 14, delineation oxide layer 16 is typically about 1000 Å to 4000 Å A thick. FIG. 3 illustrates the results produced by an oxide stripping procedure in which both oxide mask 6 and delineation oxide layer 16 have been stripped away from substrate 4. As shown in FIG. 4, after the oxide stripping procedure, the periphery of doped region 14 is defined by oxidation delineation step 18. As is seen in FIG. 4, step 18 has a quarter-circle or fillet shape.

One problem particular to substrates having a <100> crystal orientation is that, as epitaxial layers are deposited, the distinctiveness of the delineation step softens or is obscured; this softening or obscuring of the delineation step is often referred to as pattern wash-out. A washed-out delineation step is illustrated in FIG. 4A. The problem caused by the indistinct nature of the washed-out delineation step is that accurate registration with periphery 22 of doped region 14 becomes difficult or impossible.

SUMMARY OF THE INVENTION

The present invention is directed to an improved method for forming a delineation step pattern for epitaxial depositions by which pattern wash-out is substantially reduced.

The improved delineation pattern for epitaxial depositions is provided by first forming a mask on a single-crystal silicon substrate leaving a region (or regions) of the substrate exposed. The mask is typically an oxide, but it can also be a composite of oxide and nitride. The exposed region is then doped, or implanted, to create a doped region. Next, this doped region is subjected to a drive-in procedure in a drive-in furnace or to an annealing procedure in a rapid thermal processing (RTP) unit. Next, the mask used to define the outline of the doped region is also used as a mask during an anisotropic vertical etch step. This provides a delineation pattern corresponding to the periphery of the etched region. Advantageously, in accordance with the present invention, the periphery of the etched region, that is the delineation step, has a squared-off characteristic, i.e., the improved delineation step provides a first step wall generally perpendicular to the surface of the substrate and a second step wall generally parallel to the surface of the substrate. Subsequent process steps typically include removing the mask and forming one or more epitaxial layers over the substrate and the vertically etched region.

It is important that the anisotropic vertical etching step provides an essentially damage-free etched surface in order to minimize unfavorable device performance characteristics that result from propagation of damage by subsequent epitaxial growth steps. Further, it is also important that the vertical etching step be essentially residue-free so that undesirable by-products are not left in the area that will subsequently be subjected to epitaxial processing steps. This latter requirement is, however, tempered by the fact that subsequent epitaxial processing steps occur at high temperatures in a reducing ambient (typically hydrogen) environment which tends to eliminate any such residues that may be created.

The importance of the squared-off shape of the delineation step results from the fact that growth rate during epitaxial deposition is dependent upon the crystallographic orientations of the monocrystalline substrate upon which the epitaxial deposition takes place. The delineation step created by conventional procedures provides a continuum of crystallographic orientations for the epitaxial deposition along the delineation step. This range of crystallographic orientations results in a range of growth rates for the epitaxial layer or layers grown on the delineation step. The different growth rates create a softening or pattern wash-out at the delineation step. However, in accordance with the present invention, anisotropic vertical etching of the delineation pattern produces a squared-off or effectively right-angle step ideally providing only two crystallographic orientations: preferably a <110> orientation along the first or vertical step wall extending from the surface of the substrate and a <100> orientation along the second or horizontal step wall bounding the etched region. The presentation of only these two different crystallographic orientations to the epitaxial layer effectively maintains the sharp contour of the squared-off or right-angle delineation step even after one or more epitaxial layers have been grown on the substrate. This minimizes wash-out of the delineation step as occurs after creating conventional buried layer patterns formed by oxidation techniques.

Other features and advantages of the invention will appear from the description in which the preferred embodiment and method have been disclosed in conjunction with the accompanying drawings.

BRIEF DESCRIPTION OF THE FIGURE

FIG. 1 illustrates a portion of a single-crystal silicon wafer substrate having an oxide mask applied to its outer surface and a doped region created in the substrate exposed by a gap in the oxide mask;

FIG. 2 illustrates the semiconductor structure of FIG. 1 after a conventional delineation oxidation step has created a thin delineation oxide layer in the doped region of the substrate;

FIG. 3 illustrates the semiconductor structure of FIG. 2 after the oxide layer masking the outer surface of the substrate and the thin delineation oxide layer on the doped region have been stripped in a conventional manner;

FIG. 4 is an enlarged view of the conventional delineation step of FIG. 3; FIG. 4A illustrates the wash-out of the delineation step of FIG. 4 after one or more epitaxial layers have been grown on the substrate;

FIG. 5 illustrates the semiconductor structure of FIG. 1 after a light anisotropic vertical silicon etch which has removed a thin layer of the doped region of the substrate according to the present invention;

FIG. 6 illustrates the semiconductor structure of FIG. 5 after the oxide mask has been stripped from the substrate;

DETAILED DESCRIPTION

Figure 7:
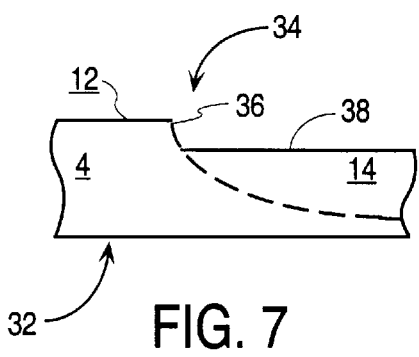
FIG. 7 is an enlarged view of the delineation step of FIG. 6 illustrating the effects of the anisotropic vertical etch which took place as shown in FIG. 5, creating a squared-off or effectively right-angle delineation step in which a first step wall is oriented generally perpendicular to the outer surface of the substrate and a second step wall is oriented generally parallel to the outer surface of the substrate.

An improved delineation pattern for epitaxial depositions is provided as follows in accordance with the present invention. Referring to FIG. 5, first mask 6 is formed on single-crystal silicon substrate 4 leaving a region (or regions) of substrate 4 exposed. Mask 6 is typically an oxide, but it can also be a composite of oxide and nitride. The exposed region is then doped, or implanted, to create a doped region 6. Next, this doped region is subjected to a drive-in procedure in a drive-in furnace or to an annealing procedure in a rapid thermal processing (RTP) unit. Next, mask 6 used to define the outline of the doped region is also used as a mask during an anisotropic vertical etch step. In accordance with the present invention, the light anisotropic vertical silicon etch performed on semiconductor structure 30 removes a thin layer, such as 1,000 Å to 4,000 Å, of doped region 14 to create the etched semiconductor structure shown in FIG. 5. This provides a delineation pattern corresponding to the periphery of the etched region. Advantageously, in accordance with the present invention, the periphery of the etched region, that is the delineation step, has a squared-off characteristic, i.e., the improved delineation step provides a first step wall generally perpendicular to the surface of the substrate and a second step wall generally parallel to the surface of the substrate. Thereafter, oxide mask 6 is removed to create the semiconductor structure 32 of FIG. 6. Subsequent process steps typically include forming one or more epitaxial layers over the substrate and the vertically etched region.

In accordance with the present invention, the anisotropic vertical silicon etch can be performed in several ways, such as plasma etching, reactive ion etching, directional inductively coupled plasma etching or electron cyclotron resonance etching. The particular vertical etch chosen is selected based upon various considerations, such as the desire to create a damage-free, residue-free silicon layer. It is important that the anisotropic vertical etching step provides an essentially damage-free etched surface in order to minimize unfavorable device performance characteristics that result from propagation of damage by subsequent epitaxial growth steps. Further, it is also important that the vertical etching step be essentially residue-free so that undesirable by-products are not left in the area that will subsequently be subjected to epitaxial processing steps. This latter requirement is, however, tempered by the fact that subsequent epitaxial processing steps occur at high temperatures in a reducing ambient (typically hydrogen) environment which tends to eliminate any such residues that may be created.

FIG. 7 illustrates the squared-off, effectively right-angle delineation step 34 created by the anisotropic vertical silicon etch step. Delineation step 34 is defined by a first step wall 36 extending generally perpendicularly into substrate 4 from surface 12, and a second step wall 38 extending generally parallel to surface 12. After one or more epitaxial layers 39 have been deposited onto semiconductor structure 32 (FIG. 7) to create semiconductor structure 32a (FIG. 7A), delineation step 34 is transformed into delineation step 40 which substantially maintains its squared-off or right-angle shape as exemplified by FIG. 7A.

Figure 7A:
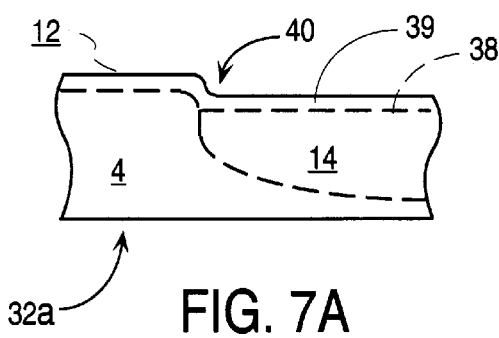
FIG. 7A illustrates the delineation step of FIG. 7 after deposition of one or more epitaxial layers illustrating how the delineation step remains distinct as opposed to the washed-out delineation step shown in FIG. 4A.
Figure 8:
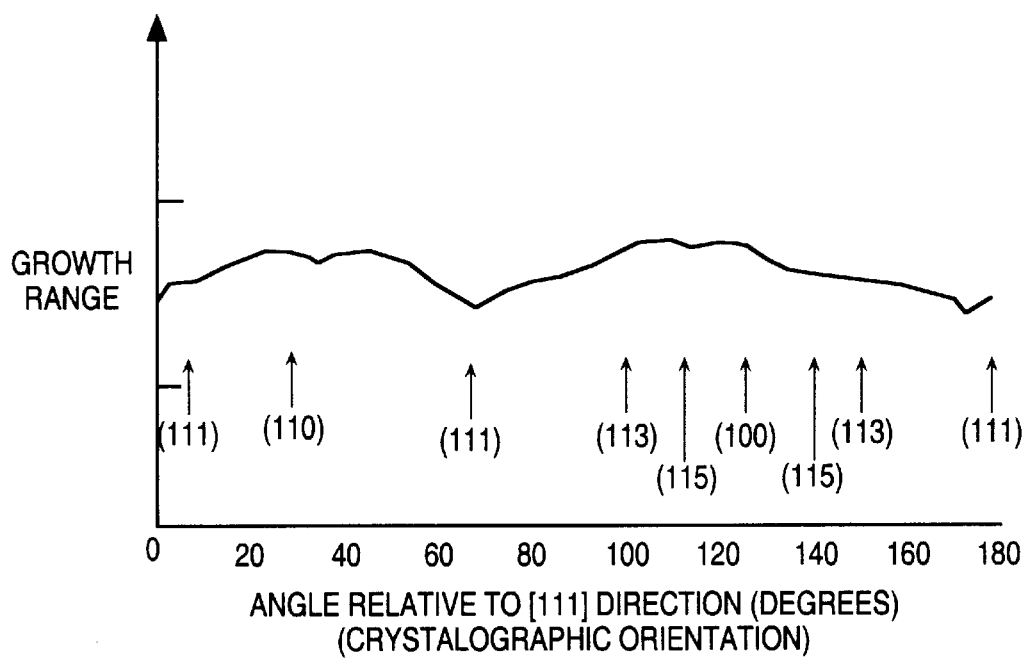
FIG. 8 is a graph showing crystallographic growth rate versus crystallographic orientation for epitaxial silicon deposition onto monocrystalline silicon.
Figure 9:
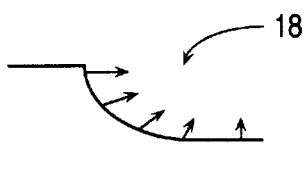
FIG. 9 illustrates the range of crystallographic orientations of the conventional oxidation delineation step of FIG. 4, which results in the wash-out of the delineation step as shown in FIG. 4A.
Figure 10:
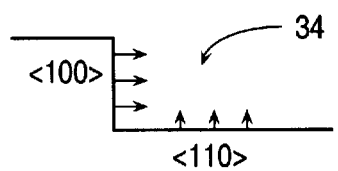
FIG. 10 illustrates how the delineation step of FIG. 7 provides only two crystallographic orientations, <100> and <110>, for the epitaxial layer to be deposited, resulting in the visually distinct delineation step shown in FIG. 7A.

The reason for the difference between the shapes of delineation steps 22 and 40 shown in FIGS. 4A and 7A, respectively, can be understood with reference to FIGS. 8–10. FIG. 8 (taken from C. H. J. van den Brekel, *J. Crystal Growth*, vol. 23, p. 260 (1974)) illustrates a graph of growth rate versus crystallographic orientation for epitaxial silicon being grown on a monocrystalline silicon substrate. FIG. 10 illustrates delineation step 34, which provides two distinct crystallographic orientations, <100> and <110>, and thus two different growth rates for epitaxial deposition. This results in the still-distinct delineation step 40 shown in FIG. 7A. In contrast, FIG. 9 illustrates that there is a continuous range of crystallographic orientations ranging from <100> through <110> with oxidation delineation step 18. However, as shown in FIG. 8, the growth rate versus crystallographic orientation varies a great deal, in no particular pattern, over that range of orientations. Because of the differing growth rates, the shape of the quarter-circle or fillet oxidation delineation step 18 created from the delineation oxidation procedure of FIGS. 2–4 is substantially lost, resulting in the washed-out delineation step 22 shown in FIG. 4A.

Modifications and variations can be made to the disclosed embodiment and method without departing from the subject of the invention as defined in the following claims. For example, while the invention is typically used to delineate or define the periphery of a doped region, it can also be used to create a delineation step over other, non-doped regions of a substrate. Also, the monocrystalline silicon substrate can be pure silicon or it can be doped with arsenic, antimony, phosphorous, or boron, for example. The examples of elements and compounds mentioned above are generally illustrative and are not meant to be limiting.

What is claimed is:

1. A method for delineating the periphery of a region of a monocrystalline silicon substrate comprising the steps of
    forming a mask on a monocrystalline substrate to define an exposed region or regions of said monocrystalline substrate wherein said mask is selected from the group consisting of an oxide and a composite of an oxide and a nitride;

placing dopants into said exposed region or regions of said monocrystalline substrate as defined by said mask to form an exposed doped region or regions;

anisotropically vertically etching a portion of said exposed doped region or regions of said substrate as defined by said mask to create a delineation pattern corresponding to the periphery.

2. The method according to claim 1 wherein the etching step is carried out by plasma etching, reactive ion etching, directional inductively coupled plasma etching or electron cyclotron resonance etching.

3. The method according to claim 1 wherein the etching step is carried out on a pure silicon substrate.

4. The method according to claim 1 wherein the etching step is carried out on a pure silicon wafer as the substrate.

5. The method according to claim 1 further comprising the step of selecting the etching step to minimize damage to, and residue left on, the silicon substrate.

6. A method for creating a delineation pattern on a substrate comprising the following steps:

forming a mask on a monocrystalline silicon substrate leaving an area of the substrate exposed;

doping said area with a dopant and annealing said substrate to drive said dopants to create a doped region defined by a periphery; and after annealing said substrate to drive said dopants, anisotropically vertically etching at least a portion of the doped region to create a delineation pattern corresponding to said doped region; and removing said mask after anistropically vertically etching said portion of the doped region.

7. The method according to claim 6 wherein the mask-forming step is carried out by forming a masking oxide layer on the substrate.

8. The method according to claim 6 wherein the doping step comprises a chosen one of the steps of ion implantation and diffusion.

9. A method for forming an epitaxial layer on a substrate comprising the following steps:

forming a mask on a substrate to leave an area of the substrate exposed;

doping said exposed area with a dopant and annealing said substrate to drive said dopant into said substrate to create a doped region defined by a periphery;

after annealing said substrate to drive said dopants, anisotropically vertically etching at least a portion of the doped region to create a delineation pattern corresponding to said doped region;

after etching said portion of said doped region, removing said mask; and forming an epitaxial layer over the doped region.

10. The method according to claim 9 wherein the forming step is carried out by forming said epitaxial layer over said doped region and a region of said substrate adjacent to said periphery.

11. A method for reducing pattern distortion of a delineation step in a monocrystalline silicon substrate comprising the following steps:

forming a mask on a substrate to leave an area of the substrate exposed;

doping said exposed area with dopants, and annealing said substrate to drive said dopants into said substrate to form a doped region defined by a periphery;

after annealing said substrate to drive said dopants, anisotropically etching a delineation step along a periphery of a region in a monocrystalline silicon substrate to form first and second step walls in said substrate, said first step wall being generally perpendicular to an outer surface of the substrate and said second step wall being generally perpendicular to the first step wall;

removing said mask after anisotropically etching said delineation step; and forming an epitaxial layer on the first and second step walls.

12. The method according to claim 11 wherein the anisotropic etching step is carried out using a plasma etching process.

13. The method according to claim 11 wherein the epitaxial layer forming step includes the step of forming an epitaxial layer on the outer surface as well as on the first and second step walls of the substrate.

* * * * *